United States Patent [19]

Takemae et al.

[11] 4,185,320

[45] Jan. 22, 1980

[54] DECODER CIRCUIT

[75] Inventors: Yoshihiro Takemae, Kawasaki; Masao Nakano, Tokyo, both of Japan

[73] Assignee: Fujitsu Limited, Kawasaki, Japan

[21] Appl. No.: 964,186

[22] Filed: Nov. 28, 1978

[30] Foreign Application Priority Data

Dec. 12, 1977 [JP] Japan ................................ 52-149064

[51] Int. Cl.$^2$ ............................................. G11C 11/40
[52] U.S. Cl. ................................... 365/203; 307/238; 365/182; 365/204
[58] Field of Search ................ 307/238; 365/182, 189, 365/202, 203, 204, 212

[56] References Cited

U.S. PATENT DOCUMENTS 4,051,388  9/1977  Inukai ................................. 365/203

*Primary Examiner*—Terrell W. Fears
*Attorney, Agent, or Firm*—Staas & Halsey

[57] ABSTRACT

Disclosed herein is a decoder circuit including: a charge up transistor for maintaining the content of input address signals; a power supply switching transistor for controlling a charge up current which is supplied to the charge up transistor; a predetermined number of selection transistors which are connected at a connection node between the charge up transistor and the power supply switching transistor for selecting an output word line, and; a bootstrap transistor which is connected at an opposite side of the connection node with respect to the charge up transistor. The characteristic feature of the present invention is the provision of a charge compensation transistor which is connected at a connection node between the charge up transistor and the power supply switching transistor so as to compensate for the charges of the charge up transistor.

11 Claims, 7 Drawing Figures

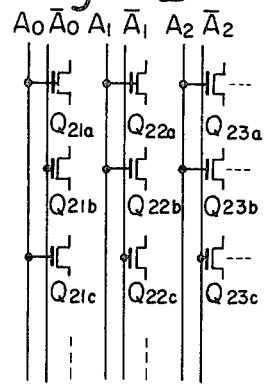
Fig. 1B
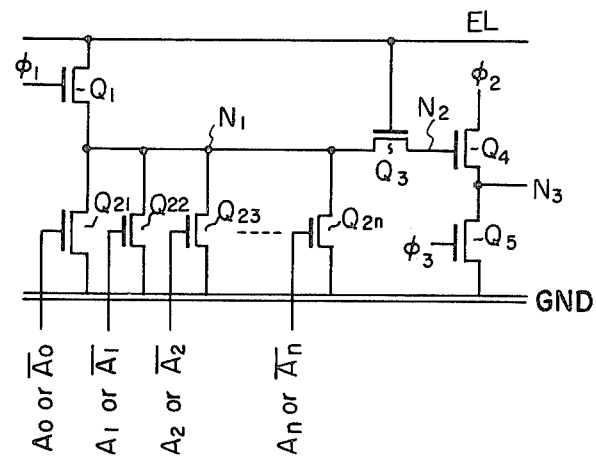
Fig. 1A
Fig. 2
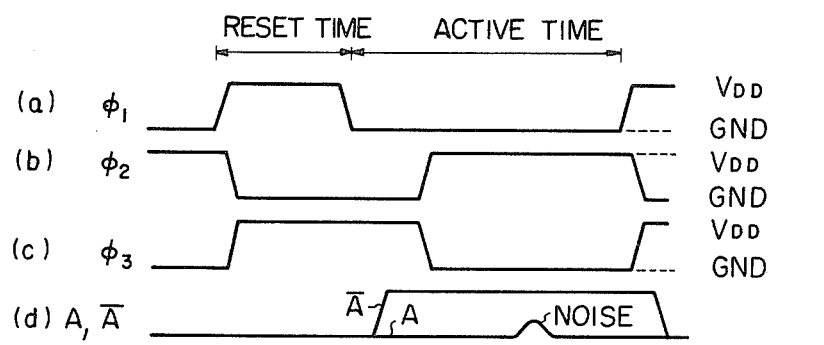
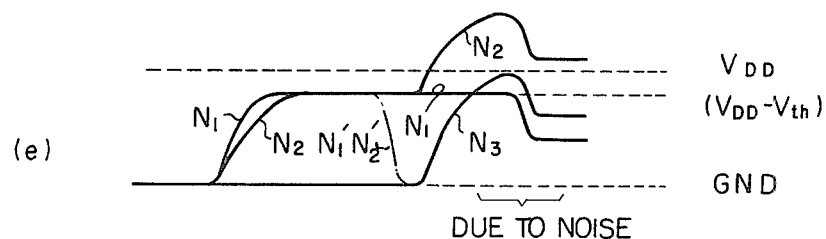

1

DECODER CIRCUIT

BACKGROUND OF THE INVENTION

1. Field of the Invention

The present invention relates to a decoder circuit. This decoder circuit is connected to one of a group of word lines which are arranged in a matrix form. Each word line is connected to a large number of binary cells. By using the decoder circuit according to the present invention, one of a large number of binary cells is selected randomly so as to write or read the data.

2. Description of the Prior Art

A dynamic ramdom access memory MOSFET integrated circuit which is conventionally used so as to write or read the data into or from a great number of storage cells is disclosed in U.S. Pat. No. 3,969,706. In FIG. 10 of U.S. Pat. No. 3,969,706, a decoder circuit is connected to one of a group of word lines which are arranged in a matrix form. Each word line is connected to a plurality of storage cells. The decoder circuit determines whether the decoder circuit selects the word line or not. This decoder circuit includes: a charge up transistor for maintaining the content of input address signals; a power supply switching transistor for controlling a charge up current which is supplied to the charge up transistor; a predetermined number of selection transistors which are connected at a connection node between the charge up transistor and the power supply switching transistor for selecting an output word line, and; a bootstrap transistor which is connected at an opposite side of the connection node with respect to the charge up transistor.

In the above described conventional decoder circuit, when noise is generated in the input address signal at a time when the decoder circuit selects the word line, the selection transistor is activated, and the charges at the connection node between the charge up transistor and the power supply source switching transistor are discharged, so that the selection level of the decoder circuit is decreased and, sometimes, a malfunction is caused.

SUMMARY OF THE INVENTION

An object of the present invention is to provide a decoder circuit which can prevent a malfunction caused by the generation of noise.

Another object of the present invention is to provide a decoder circuit which has a charge compensation transistor for compensating for the charges of the charge up transistor when the selection level of the decoder circuit is decreased by generation of noise.

For the purpose of achieving above mentioned objects, the decoder circuit according to the present invention comprises: a charge up transistor for maintaing the content of input address signals; a power supply switching transistor for controlling a charge up current which is supplied to the charge up transistor; a predetermined number of selection transistors which are connected at a connection node between the charge up transistor and the power supply switching transistor for selecting an output word line; a bootstrap transistor which is connected at an opposite side of the connection node with respect to the charge up transistor, and; a charge compensation transistor which is connected at a connection node between the charge up transistor and the power supply switching transistor, and which is placed in an on or off state in accordance with the potential level of the output word line so as to compensate for the charges of the charge up transistor.

Further features and advantages of the present invention will be apparent from the ensuing description with reference to the accompanying drawings to which, however, the scope of the invention is in no way limited.

BRIEF DESCRIPTION OF THE DRAWINGS

FIGS. 1A and 1B are connection diagrams of a conventional decoder circuit;

FIG. 2, consisting of a–d, is a graphical representations of various waveforms useful in connection with the description related to FIGS. 1A and 1B;

DETAILED DESCRIPTION OF THE PREFERRED EMBODIMENT

Figure 3:
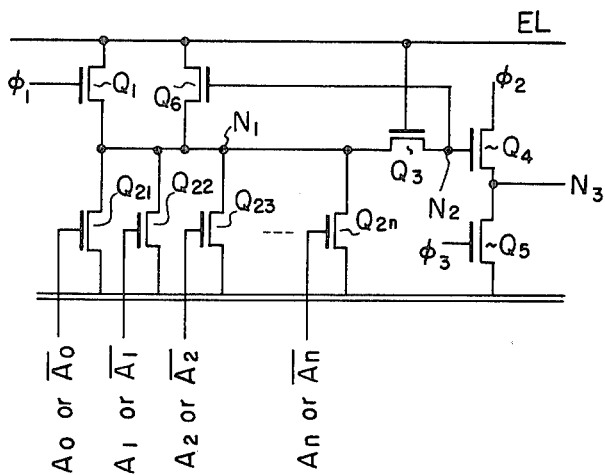
FIG. 3 is a connection diagram of one embodiment of the decoder circuit according to the present invention.

FIG. 1A illustrates a conventional decoder circuit. This decoder circuit is one of the decoder circuits which are connected to word lines of row and column circuits of a matrix. One example of the connection between address lines for selecting the desired cell in the matrix and the decoder circuit is illustrated in FIG. 1B.

In the decoder circuit illustrated in FIG. 1A, the inputs of each decoder circuit are connected to address lines $A_0$ or $\overline{A}_0$; $A_1$ or $\overline{A}_1$; $A_2$ or $\overline{A}_2$; ..., and the outputs of each decoder are connected to a word line of a row or column of the matrix. Referring to FIG. 1A, EL designates a power supply line, $Q_1$ a power supply switching transistor, $Q_{21}$, $Q_{22}$, $Q_{23}$, ..., $Q_{2n}$ selection transistors and $Q_3$ a charge up transistor; $Q_4$ designates a bootstrap transistor, $Q_5$ a low level clamp transistor, $N_1$, $N_2$ and $N_3$ connection nodes and $\phi_1$, $\phi_2$ and $\phi_3$ clock pulse signals; Ao-n, $\overline{A}$o-n designate address signals and GND a ground.

In the circuit shown in FIG. 1A, the nodes $N_1$ and $N_2$ are charged via the transistor $Q_1$ to a potential $V_{DD-Vth}$, during a precharge period, by using a clock pulse signal $\phi_1$. Here, $V_{DD}$ is a power supply voltage and $V_{th}$ is a threshold voltage of the transistor $Q_1$. The transistors $Q_{21}$, $Q_{22}$, $Q_{23}$, ..., $Q_{2n}$ are connected between the node $N_1$ and the ground, and gates of the transistors $Q_{21}$, $Q_{22}$, $Q_{23}$, ..., $Q_{2n}$ are connected to address lines $A_0$, $\overline{A}_0$; $A_1$, $\overline{A}_1$; $A_2$, $\overline{A}_2$; ..., as shown in FIG. 1B. The charge up transistor $Q_3$ is connected between the node $N_1$ and the node $N_2$ (that is the gate of the transistor $Q_4$). The bootstrap transistor $Q_4$ couples a clock pulse $\phi_2$ to the node $N_3$. The gate of the transistor $Q_3$ is connected to the potential level $V_{DD}$, so that the potential level at the gate of the transistor $Q_4$ is driven to a potential higher than the power supply potential $V_{DD}$.

In the circuit shown in FIG. 1B, when the transistor $Q_1$ is placed in the on state by a first clock pulse $\phi_1$ being applied thereto, as shown in (a) of FIG. 2, the nodes $N_1$ and $N_2$ are charged to the potential levels of $V_{DD}-V_{th}$. Charges of the potential levels in the nodes $N_1$ and $N_2$ are shown in (e) of FIG. 2.

If we assume that the address signals, A, $\overline{A}$, as shown in (d) of FIG. 2, are supplied to the transistors $Q_{21}$, $Q_{22}$, $Q_{23}$, ..., $Q_{2n}$, and the address signal A is supplied to selected decoder circuits and the address signal A is supplied to non-selected decoder circuits, the potential levels in the nodes $N_1$ and $N_2$ in the selected decoder circuits are not changed, however, the electric charges in the nodes $N_1$ and $N_2$ in the non-selected decoder circuits are discharged. This is because at least one of the transistors $Q_{21}$, $Q_{22}$, $Q_{23}$, ..., $Q_{2n}$ is placed in the on state by being applied the address signal $\overline{A}$. These conditions are shown by $N_1'$, $N_2'$ of chain lines in (e) of FIG. 2.

When a second clock pulse signal $\phi_2$, as shown in (b) of FIG. 2, is supplied to the transistor $Q_4$ and the decoder circuit is selected, the second clock pulse signal $\phi_2$ is coupled by the transistor $Q_4$ and the level at the node $N_2$ is increased to a potential higher than that of $V_{DD}+V_{th}$, as shown in (e) of FIG. 2. Therefore, an output signal appears at the node $N_3$ and the potential level in the node $N_3$ becomes the potential level $V_{DD}$, as shown in (e) of FIG. 2. A third clock pulse, shown in (c) of FIG. 2, is a low level clamping pulse which is supplied to the transistor $Q_5$.

When the potential at the node $N_1$ is charged to the potential $V_{DD}-V_{th}$, the transistor $Q_3$ is kept in the off state. In this state, if a noise signal, as shown in (d) of FIG. 2, is generated in the address signal A at a time the potential level in the node $N_3$ reaches the level $V_{DD}$, at least one of the transistors $Q_{21}$, $Q_{22}$, $Q_{23}$, ..., $Q_{2n}$ is activated and the charges in the node $N_1$ are discharged, so that the potential level in the node $N_1$ is decreased. It should be noted, that such a noise signal as mentioned above is frequently caused in the address signal A. When such a noise signal is generated, the transistor $Q_3$ is placed in the on state. Therefore, the charges in the node $N_2$ are discharged, so that the potential level in the node $N_2$ decreases. Therefore, the transistor $Q_4$ is placed in the off state, and the potential level in the node $N_3$, which should be held at the potential $V_{DD}$, is decreased.

FIG. 3 is a connection diagram of one embodiment of the decoder circuit of the present invention. In FIG. 3, the reference symbols which are the same as those of FIG. 1A designate the same components and the same nodes as in FIG. 1A.

The difference between the conventional circuit illustrated in FIG. 1A and the decoder circuit according to the present invention, illustrated in FIG. 3, is that the charge compensation transistor $Q_6$ is provided between a charge input side of the charge up transistor $Q_3$, that is, the node $N_1$ and the power supply line EL, and the transistor $Q_6$ is switched in accordance with the potential level at the node $N_2$ between the transistor $Q_3$ and the transistor $Q_4$. For example, in the decoder circuit illustrated in FIG. 3, the transistor $Q_6$ is placed in the on state when the potential level at the node $N_2$ is increased, so that the power supply voltage $V_{DD}$ is supplied to the node $N_1$.

Figure 4:
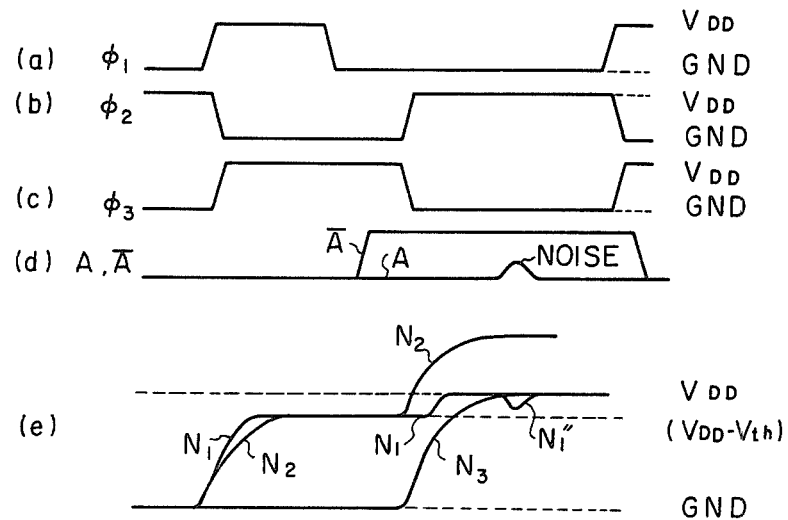
FIG. 4 is graphical representations of various waveforms useful in connection with the description related to FIG. 3.

In the decoder circuit illustrated in FIG. 3, the function before the clock signal $\phi_2$ is supplied is the same as that of the conventional decoder circuit illustrated in FIG. 1A. Therefore, only the function of the circuit illustrated in FIG. 3 after the clock signal $\phi_2$ is supplied will now be explained with reference to FIG. 4.

When the potential level of the node $N_2$ is increased, the transistor $Q_6$ is placed in the on state, so that the power supply voltage $V_{DD}$ is supplied to the node $N_1$ from the power supply line. Therefore, if noise is generated in the address signal A, as illustrated in (d) of FIG. 4, at least one of the transistors $Q_{21}$, $Q_{22}$, $Q_{23}$, ..., $Q_{2n}$ is instantaneously activated. Therefore, the charges in the node $N_1$ are discharged and the potential level of the node $N_1$ is decreased, as shown by $N_1''$ in (e) of FIG. 4. However, as the power supply voltage $V_{DD}$ is supplied from the power supply EL to the node $N_1$ via the transistor $Q_6$, the drop of the potential level is compensated for instantaneously. The transistor $Q_3$ is placed in the on state only when the potential level of the node $N_1$ decreases below the voltage level $V_{DD}-V_{th}$. However, the potential level of the node $N_1$ does not decrease below the voltage level $V_{DD}-V_{th}$. Therefore, the potential level of the node $N_2$ does not decrease and the output which is maintained at the potential level $V_{DD}$ is supplied to the node $N_3$, as shown in (e) of FIG. 4.

Figure 5:
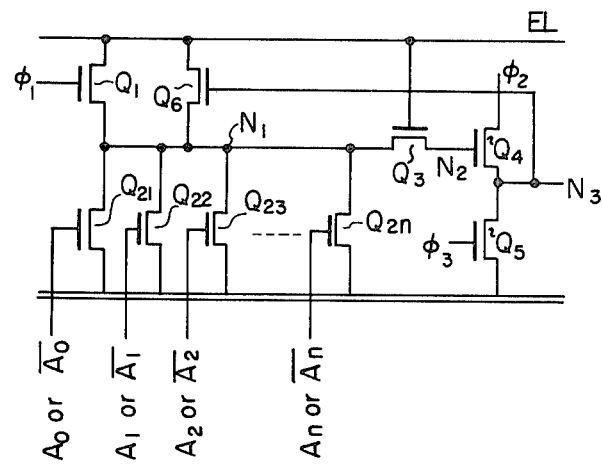
FIG. 5 is a connection diagram of another embodiment of the decoder circuit according to the present invention.
Figure 6:
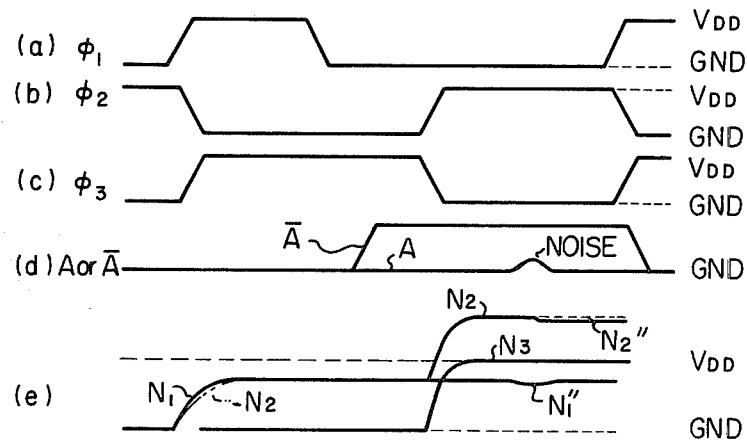
FIG. 6, consisting of a–e, is a graphical representation of various waveforms useful in connection with the description related to FIG. 5.

FIG. 5 is a connection diagram of another embodiment of the decoder circuit of the present invention. In the circuit illustrated in FIG. 5, the gate of the charge compensation transistor $Q_6$ is connected to the node $N_3$. In the circuit illustrated in FIG. 5, if noise is generated in the address signal A, as illustrated in (d) of FIG. 6, and at least one of the transistor $Q_{21}$ through $Q_{2n}$ is placed in the on state, the greater part of the current which flows via the transistors $Q_{21}$ through $Q_{2n}$ is supplied from the power supply line EL via transistor $Q_6$. Therefore, the decrease of the voltage in the node $N_2$ is very small as illustrated by $N_2''$ in (e) of FIG. 6. Even if the voltage in the node $N_2$ decreases, the voltage in the node $N_3$ does not decrease because the mutual conductance gm of the transistor $Q_4$ has sufficient value.

As described above, in the decoder circuit illustrated in FIG. 5, the voltage in the node $N_3$ can be maintained even if noise is generated in the address signals $A_O$ through $A_n$ or $\overline{A}_O$ through $\overline{A}_n$ and the transistors $Q_{21}$ through $Q_{2n}$ are placed in the on state.

As described above, according to the present invention, malfunction of the decoder circuit can be prevented and the reliability of the decoder circuit can be consierably increased, by only adding one transistor to the conventional decoder circuit, even if noise is generated in the selection transistors of the decoder circuit.

What is claimed is:

1. A decoder circuit comprising:
   an output word line for providing input address signals;
   a charge up transistor, having a charge contained thereon, for maintaining the content of said input address signals;
   a power supply switching transistor for controlling a charge up current which is supplied to said charge up transistor;
   a predetermined number of selection transistors for selecting said output word line, said predetermined number of selection transistors operatively connected at a connection node between said charge up transistor and said power supply switching transistor;
   a bootstrap transistor operatively connected at an opposite side of said connection node with respect to said charge up transistor;
   a charge compensation transistor, for compensating for the charges of said charge up transistor, operatively connected at a connection node between said charge up transistor and said power supply swtiching transistor, said charge compensation transistor being placed in an on or off state depending upon the potential level of said output word line.

2. A decoder circuit according to claim 1, wherein a gate of said charge compensation transistor is connected to a connection node between said charge up transistor and said bootstrap transistor.

3. A decoder circuit according to claim 1, wherein a low level clamp transistor is connected in series with said bootstrap transistor.

4. A decoder circuit according to claim 3, wherein a gate of said charge compensation transistor is connected to a connection node between said bootstrap transistor and said low level clamp transistor.

5. A decoder circuit operatively connected to an output word line for providing input address signals, and comprising:
   a charge up transistor, having a charge contained thereon, for storing said input address signals;
   a power supply means for supplying a charge up current to said charge up transistor;
   a power supply switching transistor for controlling said charge up current, said power supply switching transistor being operatively connected to said charge up transistor;
   a predetermined number of selection transistors for selecting said output word line, said predetermined number of selection transistors being operatively connected at a first connection node between said charge up transistor and said power supply switching transistor;
   a bootstrap transistor operatively connected at a second connection node of said charge up transistor, and
   a charge compensation transistor for compensating for the charges of said charge up transistor, said compensation transistor being connected to said first connection node and operatively controlled to be in an on or off state in dependence upon the potential level of said output word line.

6. A decoder circuit according to claim 5, wherein a gate of said charge compensation transistor is operatively connected to said second connection node.

7. A decoder circuit according to claim 5, wherein a low level clamp transistor is operatively connected in series with said bootstrap transistor.

8. A decoder circuit according to claim 7, wherein a gate of said charge compensation transistor is operatively connected at a third connection node between said bootstrap transistor and said low level clamp transistor.

9. A decoder circuit operatively connected to an output word line for providing input address signals, and comprising:
   an FET charge transistor, having a charge contained thereon, for storing said input address signals;
   a power supply means for supplying a charge up current to said FET charge up transistor;
   an FET power supply switching transistor for controlling said charge up current;
   an FET charge compensation transistor for compensating for the charges of said FET charge up transistor, wherein said power supply means is operatively connected to the drains of said FET power supply transistor and said FET charge compensation transistor and to the gate of said FET charge up transistor;
   a predetermined number of FET selection transistors for selecting said output word line, wherein
   the sources of said predetermined number of FET selection transistors are operatively connected to ground,
   each of the gates of said predetermined number of FET selection transistors receives an input address signal,
   the drains of said predetermined number of FET selection transistors are operatively connected to the sources of said FET power supply switching transistor, said FET charge compensation transistor, and said FET charge up transistor;
   an FET bootstrap transistor having its gate connected to the drain of said FET charge up transistor, and
   an FET low level clamp transistor having its source connected to ground and its drain operatively connected to the source of said FET bootstrap transistor.

10. A decoder circuit according to claim 9, wherein the gate of said FET charge compensation charge transistor is operatively connected to the source of said FET bootstrap transistor and the drain of said FET low level clamp transistor.

11. A decoder circuit according to claim 9, wherein the gate of said FET charge compensation transistor is operatively connected to the drain of said FET charge-up transistor and the gate of said FET bootstrap transistor.

* * * * *